United States Patent
Warren et al.

(10) Patent No.: US 7,198,987 B1
(45) Date of Patent: Apr. 3, 2007

(54) OVERMOLDED SEMICONDUCTOR PACKAGE WITH AN INTEGRATED EMI AND RFI SHIELD

(75) Inventors: Robert W. Warren, Newport Beach, CA (US); Suresh Jayaraman, Ladera Ranch, CA (US); Larry D. Pottebaum, Marion, IA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 10/793,618

(22) Filed: Mar. 4, 2004

(51) Int. Cl.
*H01L 21/44* (2006.01)
(52) U.S. Cl. ............... 438/112; 438/124; 438/126; 438/127
(58) Field of Classification Search ........... 438/106, 438/119, 125–127, 112, 124; 257/704, 728
See application file for complete search history.

(56) References Cited

U.S. PATENT DOCUMENTS 6,601,293 B1 * 8/2003 Glenn ..................... 29/841

2004/0180474 A1 * 9/2004 Oman ..................... 438/125
2004/0231872 A1 * 11/2004 Arnold et al. ............ 174/35 R

* cited by examiner

*Primary Examiner*—Long Pham
(74) *Attorney, Agent, or Firm*—Farjami & Farjami LLP

(57) ABSTRACT

According to one exemplary embodiment, an overmolded package comprises a semiconductor die situated on a substrate. The overmolded package further comprises an overmold situated over the semiconductor die and the substrate, where the overmold has a top surface. The overmolded package further comprises a conductive layer situated on the top surface of the overmold, where the conductive layer comprises a conductive polymer, and where the conductive layer forms an EMI and RFI shield. According to this exemplary embodiment, the overmolded package can further comprise a post situated over the substrate, where the post is connected to the conductive layer. The overmolded package can further comprise a hole situated in the overmold, where the hole is situated over the post, where the hole is filled with the conductive polymer, and where the conductive polymer is in contact with the post.

14 Claims, 3 Drawing Sheets

OVERMOLDED SEMICONDUCTOR PACKAGE WITH AN INTEGRATED EMI AND RFI SHIELD

BACKGROUND OF THE INVENTION

1. Field of the Invention

The present invention is generally in the field of semiconductor device packaging. More specifically, the invention is in the field of shielding of semiconductor device packages.

2. Related Art

Portable electronic devices, such as cell phones, typically utilize multi-component semiconductor modules to provide a high level of circuit integration in a single molded package. The multi-component semiconductor module can include, for example, a semiconductor die and a number of electronic components, which are mounted on a circuit board. The circuit board including the semiconductor die and electronic components can be encapsulated in a molding process to form an overmolded semiconductor package. To ensure an acceptable level of performance in devices such as cell phones, which are required to properly operate in diverse environments, the overmolded semiconductor package must be shielded from Electro-Magnetic Interference (EMI) and/or Radio Frequency Interference (RFI). However, semiconductor device manufacturers are challenged to provide effective EMI and RFI shielding for an overmolded semiconductor package without increasing the size of the package and without substantially increasing packaging cost.

In one approach, EMI and RFI shielding is provided by forming a discrete metal shield over the overmolded semiconductor package. The metal shield typically includes a wall, which is formed around the overmolded semiconductor package, and a cover, which is attached to the wall and situated a sufficient distance above the overmolded package to avoid interfering with the package. As a result, the metal shield undesirably increases the thickness of the final overmolded package. Also, the formation of the metal shield requires an extra process step and additional materials, which significantly increases packaging cost.

In another approach, conductive foam or rubber is applied over the overmolded semiconductor package to absorb and trap EMI. However, the conductive foam or rubber must be applied manually and requires special materials and an extra process, which significantly increases packaging cost. Additionally, the conductive foam or rubber undesirably increases the thickness of the final overmolded package.

Thus, there is a need in the art for a cost-effective EMI and RFI shield for an overmolded semiconductor package that does not substantially increase package thickness.

SUMMARY OF THE INVENTION

The present invention is directed to overmolded semiconductor package with an integrated EMI and RFI shield. The present invention addresses and resolves the need in the art for a cost-effective EMI and RFI shield for an overmolded semiconductor package that does not substantially increase package thickness.

According to one exemplary embodiment, an overmolded package comprises a semiconductor die situated on a substrate. The overmolded package further comprises an overmold situated over the semiconductor die and the substrate, where the overmold has a top surface. The overmolded package further comprises a conductive layer situated on the top surface of the overmold, where the conductive layer comprises a conductive polymer, and where the conductive layer forms an EMI and RFI shield. For example, the conductive layer can have a thickness of between approximately 25.0 microns and approximately 125.0 microns.

According to this exemplary embodiment, the overmolded package can further comprise a post situated over the substrate, where the post is connected to the conductive layer. For example, the post can be situated on a solder pad, where the solder pad is connected to a reference voltage. The post can have a width of between approximately 100.0 microns and approximately 200.0 microns, for example. The overmolded package can further comprise a hole situated in the overmold, where the hole is situated over the post, where the hole is filled with the conductive polymer, and where the conductive polymer is in contact with the post. According to one embodiment, the invention is a method for achieving the above-described structure. Other features and advantages of the present invention will become more readily apparent to those of ordinary skill in the art after reviewing the following detailed description and accompanying drawings.

DETAILED DESCRIPTION OF THE INVENTION

The present invention is directed to overmolded semiconductor package with an integrated EMI and RFI shield. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
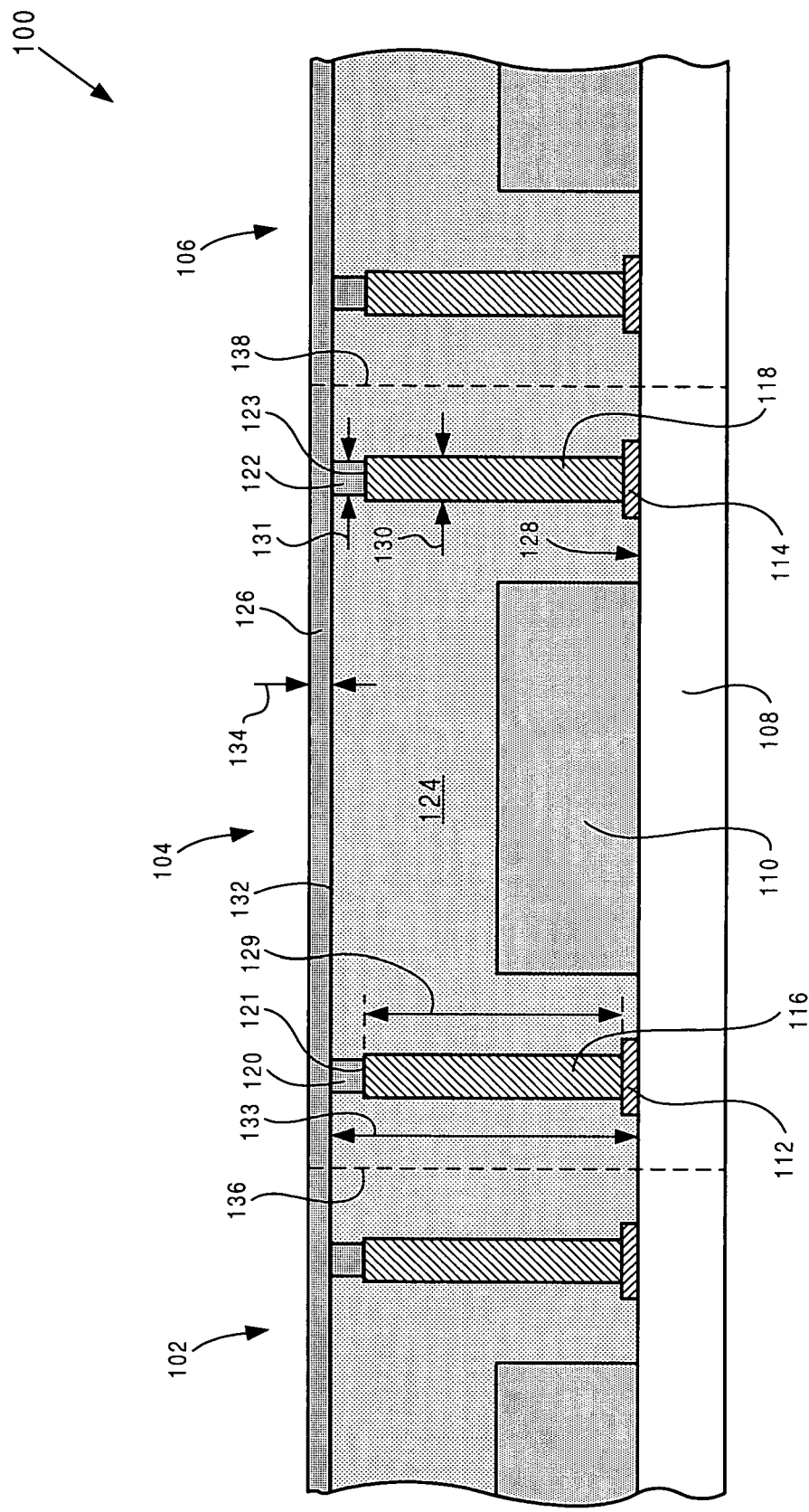
FIG. 1 illustrates a cross sectional view of an exemplary structure including an exemplary overmolded semiconductor package in accordance with one embodiment of the present invention.

FIG. 1 shows a cross-sectional view of structure 100, which is utilized to describe one embodiment of the present invention. Certain details and features have been left out of FIG. 1 that are apparent to a person of ordinary skill in the art. Structure 100 includes overmolded semiconductor packages 102, 104, and 106, which are shown in strip format prior to being singulated, i.e. separated, in a subsequent saw singulation process. It is noted that in FIG. 1, only overmolded semiconductor package 104, which is also referred to as an "overmolded package" in the present application, is discussed in detail herein to preserve brevity. Overmolded semiconductor package 104 includes substrate 108, semiconductor die 110, solder pads 112 and 114, posts 116 and 118, holes 120 and 122, overmold 124, and conductive layer 126. It is also noted that although only three attached overmolded semiconductor packages, i.e. overmolded semiconductor packages 102, 104, and 106, are shown in FIG. 1 to preserve brevity, structure 100 can comprise any number of attached overmolded semiconductor packages.

As shown in FIG. 1, semiconductor die 110 is situated on top surface 128 of substrate 108, which can be, for example, a laminate circuit board. Also shown in FIG. 1, solder pads 112 and 114 are situated on top surface 128 of substrate 108. Solder pads 112 and 114 can comprise a metal such as copper or aluminum and can be formed, for example, by depositing and patterning a layer of metal, such as copper or aluminum, and plating the layer of metal with gold. Solder pads 112 and 114 are connected to a reference potential (not shown in FIG. 1), which can be any constant DC plane that does not have an AC component. Further shown in FIG. 1, posts 116 and 118 are situated on respective solder pads 112 and 114 and have respective top surfaces 121 and 123 and width 130 and height 129. By way of example, width 130 can be between approximately 100.0 microns and approximately 200.0 microns. By way of example, height 129 can be between approximately 90.0% and approximately 95.0% of height 133, which is the distance between top surface 132 of overmold 124 and top surface 128 of substrate 108.

Posts 116 and 118 can be surface mountable posts and can comprise gold-plated copper or other appropriate compound metal or metal. In one embodiment, posts 116 and 118 can comprise a ceramic material having a metal coating. Posts 116 and 118 can be attached to respective solder pads 112 and 114 with solder by utilizing a surface mount assembly process or other appropriate process. In one embodiment, a post, such as post 116, can be attached to a terminal of a component, such as a capacitor, that is coupled to a reference potential. In other embodiments, an overmolded semiconductor package, such as overmolded semiconductor package 104, can comprise one or more posts, such as posts 116 and 118.

Also shown in FIG. 1, overmold 124 is situated over substrate 108, semiconductor die 110, solder pads 112 and 114 and posts 116 and 118 and can comprise an epoxy molding compound or other appropriate molding compound and can be formed in a molding process in a manner known in the art. Overmold 124 has top surface 132, which has height 133. By way of example, height 133 can be between approximately 700.0 microns and approximately 1300.0 microns.

Further shown in FIG. 1, holes 120 and 122 are situated in overmold 124 and over posts 116 and 118, respectively, and have width 131. By way of example, width 131 can be approximately 100.0 microns. Holes 120 and 122 can be formed in overmold 124 by a mechanical process such as drilling, by a laser, or by other appropriate process. Holes 120 and 122 are formed over respective posts 116 and 118 to a sufficient depth in overmold 124 such that top surfaces 121 and 123 of respective posts 116 and 118 are exposed. After formation, holes 120 and 122 can be filled with a conductive material, such as a conductive polymer, such that the conductive material contacts top surfaces 121 and 123 of respective posts 116 and 118.

Also shown in FIG. 1, conductive layer 126 is situated on top surface 132 of overmold 124. Conductive layer 126 can comprise a conductive polymer, which can include a metal such as silver or copper, or other appropriate conductive material. In one embodiment, conductive layer 126 can comprise a metal foil. Conductive layer 126 has thickness 134, which can be between approximately 25.0 microns and approximately 125.0 microns. Conductive layer 126 can be formed by utilizing a painting process, screen printing process, sputter deposition process, or other appropriate process to apply a conductive material, such as a conductive polymer, on top surface 132 of overmold 124. During the formation of conductive layer 126, the conductive material flows into holes 120 and 122 and contacts respective posts 116 and 118. As a result, an electrical connection is formed between conductive layer 126, posts 116 and 118, and respective solder pads 112 and 114. Since solder pads 112 and 114 are connected to a reference potential, conductive layer 126 is connected to the reference potential by the conductive material that fills holes 120 and 122, respective posts 116 and 118, and respective solder pads 112 and 114. In one embodiment, posts 116 and 118 are not utilized and conductive layer 126 is connected to an available terminal that is connected to a reference potential, such as a capacitor terminal or a bond pad that is a reference potential.

In one embodiment, one or more springs can be utilized in place of posts 116 and 118. In such embodiment, holes 120 and 122 would not needed, since the spring or springs would be exposed at top surface 132 of overmold 124 and would, consequently, make a direct connection with conductive layer 126. Thus, since conductive layer 126 is situated on top surface 132 of overmold 124 and is connected to a reference potential, conductive layer 126 provides an integrated shield that effectively protects overmolded semiconductor package 104, including semiconductor 110 and other components (not shown in FIG. 1), from EMI and RFI. After formation of conductive layer 126, a saw singulation process can be utilized to singulate, i.e. separate, overmold semiconductor package 104 from overmold semiconductor packages 102 and 106 at respective dashed lines 136 and 138.

Thus, by forming conductive layer 126 on top surface 132 of overmold 124 by utilizing a conductive material, such as a conductive polymer, the embodiment of the present invention in FIG. 1 advantageously achieves an integrated shield that effectively protects overmolded semiconductor package 104 from EMI and RFI. Also, conductive layer 126 can be applied to overmolded semiconductor packages while they are attached in a strip format, which allows conductive layer 126 to be effectively applied in an automated process. As a result, the embodiment of the present invention in FIG. 1 achieves an effective EMI and RFI shield for an overmold semiconductor package at reduced packaging cost. Additionally, the embodiment of the present invention in FIG. 1 provides an EMI and RFI shield that does not require expensive materials, such as a conventional discrete metal shield, which also reduces packaging cost. Furthermore, by utilizing a sufficiently thin conductive layer, the embodiment of the present invention in FIG. 1 achieves an integrated EMI and RFI shield which advantageously causes only a small increase in overall thickness of the overmold semiconductor package.

Figure 2:
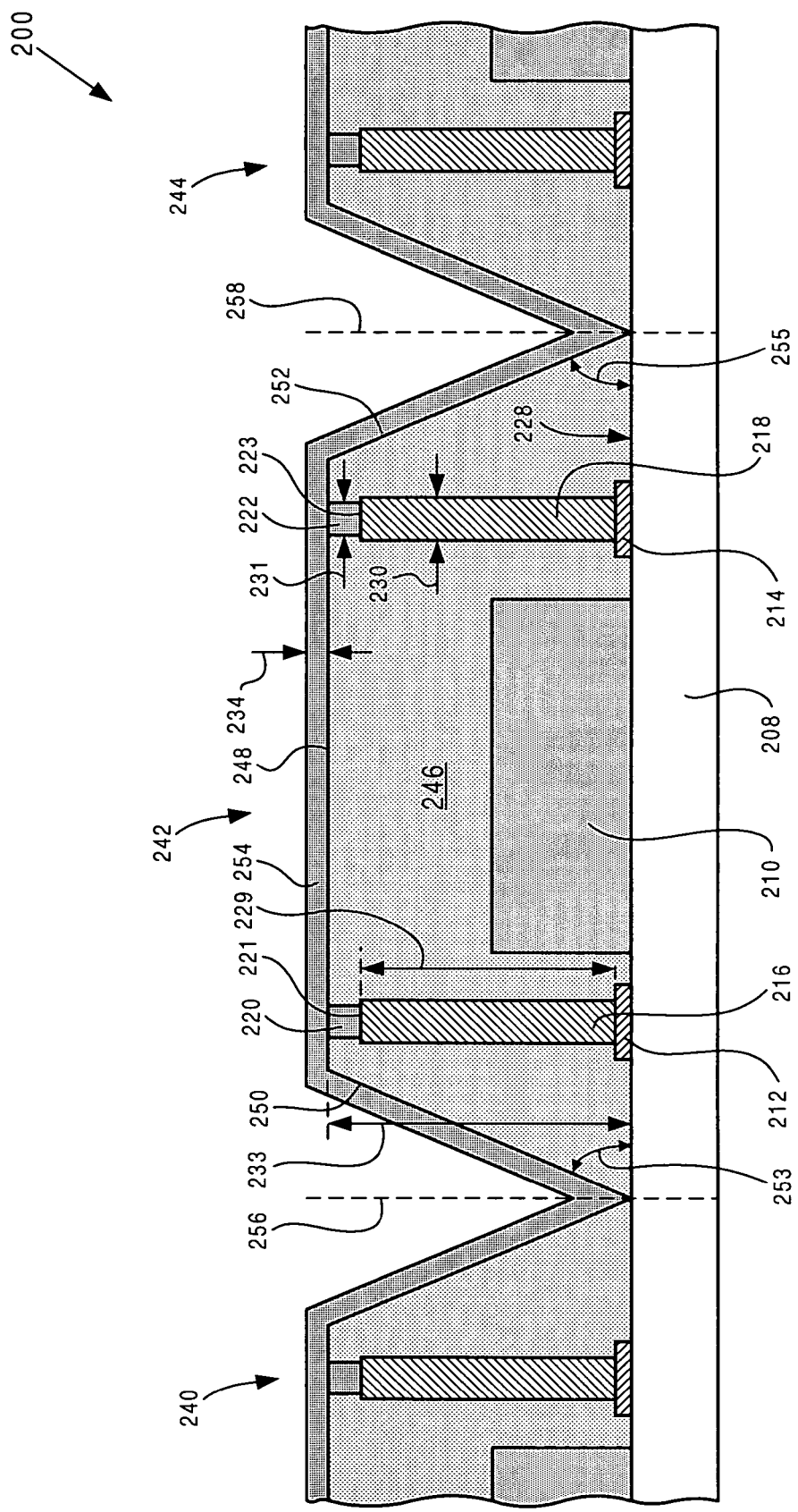
FIG. 2 illustrates a cross sectional view of an exemplary structure including an exemplary overmolded semiconductor package in accordance with one embodiment of the present invention.

FIG. 2 shows a cross-sectional view of structure 200, which is utilized to describe one embodiment of the present invention. Certain details and features have been left out of FIG. 2 that are apparent to a person of ordinary skill in the art. Structure 200 includes overmolded semiconductor packages 240, 242, and 244, which are shown in strip format prior to being singulated, i.e. separated, in a subsequent saw singulation process. It is noted that in FIG. 2, only overmolded semiconductor package 242 is discussed in detail herein to preserve brevity. In FIG. 2, substrate 208, semiconductor die 210, solder pads 212 and 214, posts 216 and 218, holes 220 and 222, top surfaces 221, 223, and 228, widths 230 and 231, heights 229 and 233, and thickness 234 in structure 200 correspond, respectively, to substrate 108, semiconductor die 110, solder pads 112 and 114, posts 116 and 118, holes 120 and 122, top surfaces 121, 123, and 128, widths 130 and 131, heights 229 and 233, and thickness 134 in structure 100 in FIG. 1.

Overmolded semiconductor package 242 includes substrate 208, semiconductor die 210, solder pads 212 and 214, posts 216 and 218, holes 220 and 222, overmold 246. It is noted that although only three attached overmolded semiconductor packages, i.e. overmolded semiconductor packages 240, 242, and 244, are shown in FIG. 2 to preserve brevity, structure 200 can comprise any number of attached overmolded semiconductor packages.

As shown in FIG. 2, semiconductor die 210 and solder pads 212 and 214 are situated on top surface 228 of substrate 208. Solder pads 212 and 214 are substantially similar in composition and formation to solder pads 112 and 114 in FIG. 1 and are connected to a reference potential (not shown in FIG. 2), which can be any constant DC plane that does not have an AC component. Also shown in FIG. 1, posts 216 and 218 are situated on solder pads 212 and 214, respectively, and are substantially similar in composition, width, height, and formation to posts 116 and 118 in FIG. 1.

Further shown in FIG. 2, overmold 246 is situated over substrate 208, semiconductor die 210, solder pads 212 and 214 and posts 216 and 218 and can comprise an epoxy molding compound or other appropriate molding compound. Overmold 246 has top surface 248 and side surfaces 250 and 252 and can be formed in a molding process in a manner known in the art. Side surfaces 250 and 252 are situated at respective angles 253 and 255 with respective to top surface 228 of substrate 208. In the present embodiment, angles 253 and 255 are less than 90.0 degrees. Also shown in FIG. 2, holes 220 and 222 are situated in overmold 246 over posts 216 and 218, respectively, and have width 231. Holes 220 and 222 are substantially similar in width and formation to holes 120 and 122 in FIG. 1. After formation, holes 220 and 222 can be filled with a conductive material, such as a conductive polymer, which contacts respective top surfaces 221 and 223 of respective posts 216 and 218.

Further shown in FIG. 2, conductive layer 254 is situated on top surface 248 and side surfaces 250 and 252 of overmold 246. Conductive layer 254 is substantially similar in composition to conductive layer 126 in FIG. 1 and has thickness 234, which can be between approximately 25.0 microns and approximately 125.0 microns. Conductive layer 254 can be formed by utilizing a painting process, a screen printing process, a sputter deposition process, or other appropriate process to apply a conductive material, such as a conductive polymer, to top surface 248 and side surfaces 250 and 252 of overmold 246. During formation of conductive layer 254, the conductive material flows into holes 220 and 222 in overmold 246 and contacts respective posts 216 and 218. As a result, an electrical connection is formed between conductive layer 254, posts 216 and 218, and respective solder pads 212 and 214. Since solder pads 212 and 214 are connected to a reference potential, conductive layer 254 is connected to the reference potential by the conductive material that fills holes 220 and 222, respective posts 216 and 218, and respective solder pads 212 and 214. In one embodiment, posts 216 and 218 are not utilized and conductive layer 254 is connected to an available terminal that is connected to a reference potential, such as a capacitor terminal or a bond pad that is a reference potential.

Thus, since conductive layer 254 is situated on top surface 248 and on side surfaces 250 and 252 of overmold 246 and is electrically connected to a reference potential, conductive layer 254 provides an integrated shield that effectively protects overmold semiconductor package 242, including semiconductor 210 and other components (not shown in FIG. 2), from EMI and RFI. After formation of conductive layer 254, a saw singulation process can be utilized to singulate, i.e. separate, overmold semiconductor package 242 from overmold semiconductor packages 240 and 244 at respective dashed lines 256 and 258.

Thus, by forming a conductive layer comprising a conductive material such as a conductive polymer on top and side surfaces of the overmold, the embodiment of the present invention in FIG. 2 advantageously achieves an integrated shield that effectively protects the overmolded package from EMI and RFI and provides similar advantages as the embodiment of the present invention in FIG. 1 discussed above. Also, by forming a conductive layer comprising a conductive material, such as a conductive polymer, on the side surfaces in addition to the top surface of the overmold, the embodiment of the present invention in FIG. 2 achieves an integrated shield that provides increased EMI and RFI protection for the overmolded package.

Figure 3:
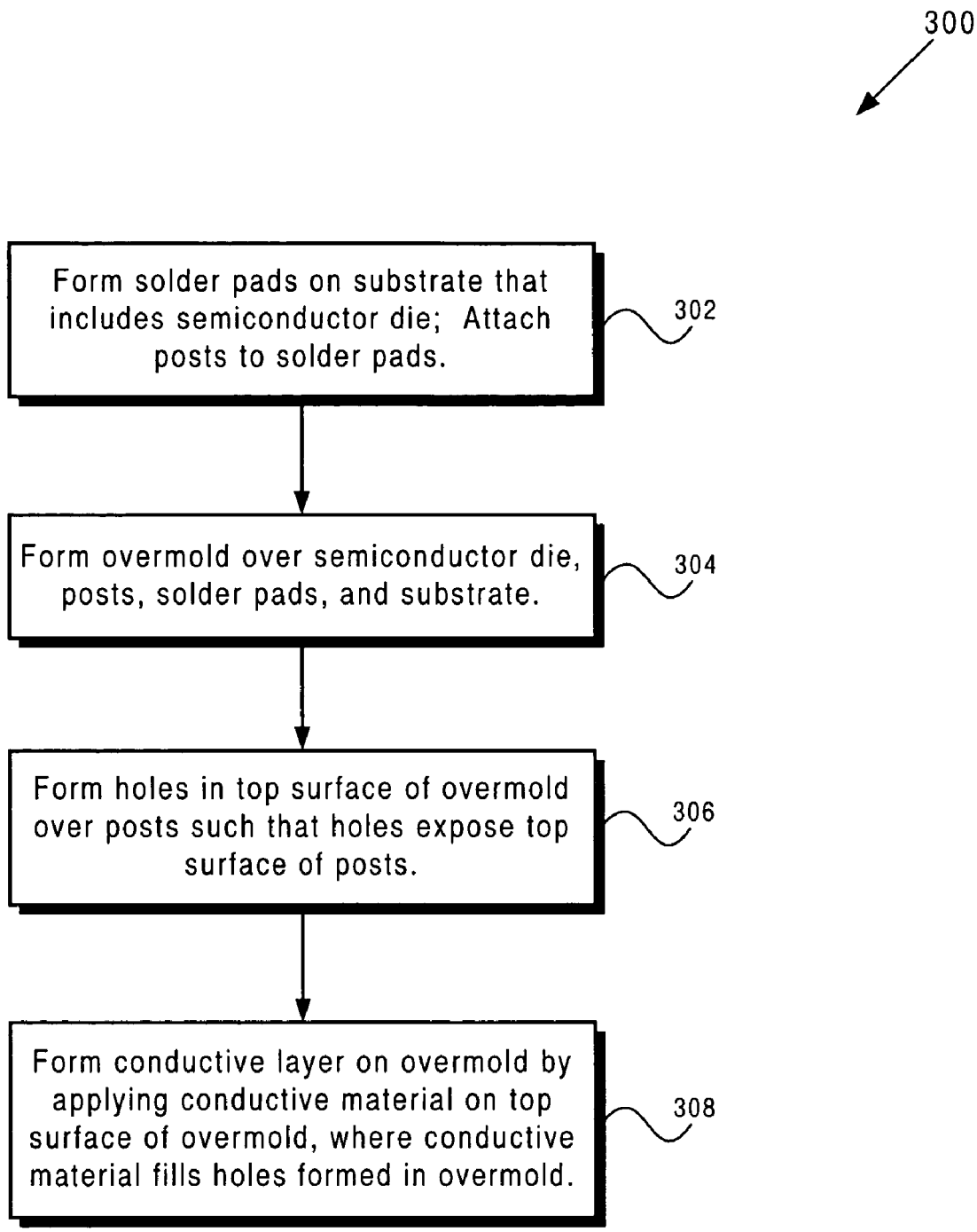
FIG. 3 is a flowchart corresponding to exemplary method steps according to one embodiment of the present invention.

FIG. 3 shows a flowchart illustrating an exemplary method according to one embodiment of the present invention. In particular, flowchart 300 illustrates an exemplary method of forming the embodiment of the present invention in FIG. 1. Certain details and features have been left out of flowchart 300 that are apparent to a person of ordinary skill in the art. For example, a step may consist of one or more substeps or may involve specialized equipment or materials, as known in the art. At step 302, solder pads 112 and 114 in FIG. 1 are formed on substrate 108, which includes semiconductor die 110, and posts 116 and 118 are attached to solder pads 112 and 114, respectively. For example, solder pads 112 and 114 can be formed by depositing and patterning a layer of metal, such as copper, on substrate 108 and plating the copper with gold. For example, posts 116 and 118 can comprise gold-plated copper and can be attached to respective solder pads 112 and 114 with solder by utilizing a surface mount assembly process or other appropriate process. Solder pads 112 and 114 are connected to a reference potential (not shown in FIG. 1), which can be any constant DC plane that does not have an AC component.

At step 304, overmold 124 in FIG. 1 is formed over semiconductor die 110, posts 116 and 118, solder pads 112 and 114, and substrate 108. For example, overmold 124 can comprise an epoxy molding compound or other appropriate molding compound and can be formed in a molding process in a manner known in the art. At step 306, holes 120 and 122 are formed in top surface 132 of overmold 124 over respective posts 116 and 118 such that holes 120 and 122 expose respective top surfaces 121 and 123 of respective posts 116 and 118. For example, holes 120 and 122 can be formed by a mechanical process such as drilling, by laser, or by other appropriate process.

At step 308, conductive layer 126 is formed on overmold 124 by applying a conductive material on top surface 132 of overmold 124, where the conductive material fills holes 120 and 122 formed in overmold 124 over respective posts 116 and 118. For example, conductive layer 126 can comprise a conductive polymer, which can be applied to top surface 132 of overmold 124 by utilizing a painting process, a screen printing process, sputter deposition process, or other appropriate process. During formation of conductive layer 126, the conductive polymer fills holes 120 and 122 and contacts posts 116 and 118. As a result, an electrical connection is formed between conductive layer 126 and posts 116 and 118. Since posts 116 and 118 are connected to a reference potential via respective solder pads 112 and 114, conductive layer 126 is also connected to the reference potential by the conductive polymer in holes 120 and 122. As a result, conductive layer 126 forms an effective EMI and RFI shield, which is integrated in overmolded semiconductor package 104.

Thus, as discussed above, in the embodiments of the present invention in FIGS. 1 and 2, by forming a conductive layer comprising a conductive material, such as a conductive polymer, on an overmold, the present invention advantageously achieves an effective EMI and RFI shield for an overmolded package that is cost effective and does not substantially increase the size of the overmolded package.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, overmolded semiconductor package with an integrated EMI and RFI shield has been described.

The invention claimed is:

1. An overmolded package comprising:
a semiconductor die situated on a substrate;
a solder pad situated on said substrate, said solder pad being connected to a reference voltage;
a post situated on said solder pad, said solder pad connecting said post to said reference voltage;
an overmold situated over said semiconductor die and said substrate, said overmold having a top surface;
a conductive layer situated on said top surface of said overmold, said post being connected to said conductive layer, wherein said conductive layer comprises a conductive polymer;
wherein said conductive layer forms an EMI and RFI shield, and wherein said conductive layer is a topmost layer of said overmolded package.

2. The overmolded package claim 1 further comprising a hole situated in said overmold, said hole being situated over said post, said hole being filled with said conductive polymer, said conductive polymer being in contact with said post.

3. The overmolded package of claim 1 wherein said conductive layer has a thickness of between approximately 25.0 microns and approximately 125.0 microns.

4. The overmolded package of claim 1 wherein said post has a width of between approximately 100.0 microns and approximately 200.0 microns.

5. A method of forming an overmolded package, said method comprising steps of:
forming a solder pad on a substrate and attaching a post to said solder pad, said solder pad being connected to a reference voltage;
forming an overmold over a semiconductor die situated on said substrate and over said substrate;
forming a conductive layer on a top surface of said overmold such that said post is connected to said conductive layer, wherein said conductive layer comprises a conductive polymer;
wherein said conductive layer forms an EMI and RFI shield, and wherein said conductive layer is a topmost layer of said overmolded package.

6. The method of claim 5 further comprising a step of forming a hole in said overmold such that said hole exposes a top surface of said post after said step of forming said overmold and before said step of forming said conductive layer.

7. The method of claim 6 wherein said step of forming said conductive layer comprising filling said hole in said overmold with said conductive polymer.

8. The method of claim 5 wherein said conductive layer has a thickness of between approximately 25.0 microns and approximately 125.0 microns.

9. The method of claim 5 wherein said post has a width of between approximately 100.0 microns and approximately 200.0 microns.

10. An overmolded package comprising:
a semiconductor die situated on a substrate;
a plurality of solder pads situated on said substrate said plurality of solder pads being connected to a reference voltage;
a plurality of posts, each of said plurality of posts respectively situated on each of said plurality of solder pads, said plurality of solder pads connecting said plurality of posts to said reference voltage;
an overmold situated over said semiconductor die and said plurality of posts, said overmold having a top surface;
a conductive layer situated on said top surface of said overmold such that said overmold is situated between said conductive layer and said semiconductor die, said conductive layer comprising a conductive polymer, said conductive layer being connected to said plurality of posts;
wherein said conductive layer forms an EMI and RFI shield, and wherein said conductive layer is a topmost layer of said overmolded package.

11. The overmolded package of claim 10 further comprising a plurality of holes formed in said overmold, said plurality of holes being situated over said plurality of posts, said plurality of holes being filled with said conductive polymer, said conductive polymer being in contact with said plurality of posts.

12. The overmolded package of claim 10 wherein overmold comprises side surfaces, said conductive layer being situated on said side surfaces.

13. The overmolded package of claim 10 wherein said conductive layer has a thickness of between approximately 25.0 microns and approximately 125.0 microns.

14. The overmolded package of claim 10 wherein each of said plurality of posts has a width of between approximately 100.0 microns and approximately 200.0 microns.

* * * * *

UNITED STATES PATENT AND TRADEMARK OFFICE
CERTIFICATE OF CORRECTION

PATENT NO. : 7,198,987 B1
APPLICATION NO. : 10/793618
DATED : April 3, 2007
INVENTOR(S) : Warren et al.

It is certified that error appears in the above-identified patent and that said Letters Patent is hereby corrected as shown below:

In the claims, column 8, line 26, "substrate said" should be changed to --substrate, said--.

Signed and Sealed this

Nineteenth Day of June, 2007

JON W. DUDAS
*Director of the United States Patent and Trademark Office*